(12) United States Patent
Matsuura et al.

(10) Patent No.: US 11,756,845 B2
(45) Date of Patent: Sep. 12, 2023

(54) COPPER FOIL WITH GLASS CARRIER AND PRODUCTION METHOD THEREFOR

(71) Applicant: MITSUI MINING & SMELTING CO., LTD., Tokyo (JP)

(72) Inventors: Yoshinori Matsuura, Ageo (JP); Takenori Yanai, Ageo (JP); Toshimi Nakamura, Ageo (JP)

(73) Assignee: MITSUI MINING & SMELTING CO., LTD., Tokyo (JP)

( * ) Notice: Subject to any disclaimer, the term of this patent is extended or adjusted under 35 U.S.C. 154(b) by 586 days.

(21) Appl. No.: 16/971,154

(22) PCT Filed: Feb. 13, 2019

(86) PCT No.: PCT/JP2019/005111
§ 371 (c)(1),
(2) Date: Aug. 19, 2020

(87) PCT Pub. No.: WO2019/163605
PCT Pub. Date: Aug. 29, 2019

(65) Prior Publication Data
US 2020/0411396 A1  Dec. 31, 2020

(30) Foreign Application Priority Data
Feb. 20, 2018  (JP) .................................. 2018-027929

(51) Int. Cl.
*B32B 15/04* (2006.01)
*B32B 17/06* (2006.01)
(Continued)

(52) U.S. Cl.
CPC .............. *H01L 23/13* (2013.01); *B32B 15/04* (2013.01); *C03C 17/09* (2013.01);
(Continued)

(58) Field of Classification Search
CPC ....................................................... H05K 1/09
(Continued)

(56) References Cited

U.S. PATENT DOCUMENTS 6,924,043 B2 * 8/2005 Suzuki ..................... C25D 5/10
428/618
7,223,481 B2 * 5/2007 Suzuki ................... H05K 3/384
428/656
(Continued)

FOREIGN PATENT DOCUMENTS

JP  2000-331537 A  11/2000
JP  2005-076091 A   3/2005
(Continued)

OTHER PUBLICATIONS

ISR issued in WIPO Patent Application No. PCT/JP2019/005111, mailed Apr. 10, 2019, English translation.
(Continued)

*Primary Examiner* — Lauren R Colgan
(74) *Attorney, Agent, or Firm* — GREENBLUM & BERNSTEIN, P.L.C.

(57) ABSTRACT

A glass carrier-attached copper foil is provided that can achieve a desired circuit mounting board that reduces separation of a copper layer at the cut edge even if the copper foil is downsized to dimensions enabling mount of a circuit, and has an intended circuit pattern with a fine pitch. The glass carrier-attached copper foil includes a glass carrier, a release layer, and a copper layer with a thickness of 0.1 to 3.0 μm. The glass carrier has, at least on its surface having the copper layer thereon, a plurality of flat regions each having a maximum height Rz of less than 1.0 μm as measured in accordance with JIS B 0601-2001 and a rough region having a maximum height Rz of 1.0 to 30.0 μm as measured in accordance with JIS B 0601-2001. The rough region has a pattern of lines that define the flat regions.

16 Claims, 3 Drawing Sheets

(51) Int. Cl.
  *H01L 23/13*    (2006.01)
  *H01L 21/48*    (2006.01)
  *H01L 23/15*    (2006.01)
  *H01L 23/498*   (2006.01)
  *H05K 1/09*     (2006.01)
  *C03C 17/09*    (2006.01)
  *C03C 17/36*    (2006.01)
  *C23C 14/18*    (2006.01)

(52) U.S. Cl.
  CPC ........ *C03C 17/3639* (2013.01); *C23C 14/185* (2013.01); *H01L 21/4846* (2013.01); *H01L 23/15* (2013.01); *H01L 23/49838* (2013.01); *H01L 23/49866* (2013.01); *H05K 1/09* (2013.01); *C03C 2218/154* (2013.01)

(58) Field of Classification Search
  USPC ........................................................ 428/433
  See application file for complete search history.

(56) References Cited

U.S. PATENT DOCUMENTS

| | | | |
|---|---|---|---|
| 7,976,956 B2* | 7/2011 | Suzuki | B32B 15/20 428/209 |
| 10,356,915 B2* | 7/2019 | Matsuura | C23C 14/06 |
| 10,886,146 B2* | 1/2021 | Matsuura | G03F 7/164 |
| 11,576,267 B2* | 2/2023 | Matsuura | H01L 23/49861 |
| 2005/0048306 A1* | 3/2005 | Suzuki | H05K 3/384 428/548 |
| 2013/0220679 A1 | 8/2013 | Kawakami | |
| 2019/0013212 A1* | 1/2019 | Matsuura | H05K 999/99 |
| 2019/0029125 A1* | 1/2019 | Matsuura | C23C 14/5873 |

FOREIGN PATENT DOCUMENTS

| | | |
|---|---|---|
| JP | 2016/49651 A | 4/2016 |
| JP | 2016-137727 A | 8/2016 |
| JP | 2016-178101 A | 10/2016 |
| JP | 2016-203409 A | 12/2016 |
| KR | 10-2013-0098359 | 9/2013 |
| TW | 2017-42225 A | 12/2017 |
| WO | 2014/054812 A1 | 4/2014 |
| WO | 2017/150283 A1 | 9/2017 |
| WO | 2017/150284 A1 | 9/2017 |

OTHER PUBLICATIONS

Written Opinion issued in WIPO Patent Application No. PCT/JP2019/005111, dated Apr. 16, 2019, English translation.

TW OA issued in TW Patent Application No. 108105368, mailed Apr. 14, 2020, English translation.

* cited by examiner

COPPER FOIL WITH GLASS CARRIER AND PRODUCTION METHOD THEREFOR

TECHNICAL FIELD

The present invention relates to a glass carrier-attached copper foil and a method of producing the glass carrier-attached copper foil.

BACKGROUND ART

Printed circuit boards with finer wiring patterns (finer pitches) have been required as electronic devices, such as mobile electronic devices, are compact and advanced. In order to meet such a request, preferred are copper foils for manufacture of printed circuit boards that have smaller thicknesses and lower surface roughness. For example, Patent Document 1 (JP2005-76091A) discloses a method of manufacturing a carrier-attached ultrathin copper foil, including laminating a release layer and an ultrathin copper foil in sequence on a smooth face of the copper foil, where the average surface roughness Rz of the copper foil is reduced to 0.01 to 2.0 µm. Patent Document 1 also discloses subjecting the carrier-attached ultrathin copper foil to a process for formation of a highly dense ultrafine trace (a fine pattern) to produce a multi-layered printed circuit board.

In order to achieve further reductions in thicknesses and surface roughness of ultrathin copper foils with carriers, it has been also proposed to use, for example, a glass substrate or a polished metal-substrate as a super-smooth carrier instead of a traditional resin carrier that has been typically used, and form an ultrathin copper layer on the super-smooth carrier by a gas-phase process, for example, by sputtering. For example, Patent Document 2 (WO2017/150283) discloses a carrier-attached copper foil, including, in sequence, a carrier (for example, a glass carrier), a release layer, an antireflective layer, and an ultrathin copper layer, where the release layer, the antireflective layer, and the ultrathin copper layer are formed by sputtering. Patent Document 3 (WO2017/150284) discloses a carrier-attached copper foil, including a carrier (for example, a glass carrier), intermediate layers (for example, an adhesive metal layer and a release assisting layer), a release layer, and an ultrathin copper layer, where the intermediate layers, the release layer, and the ultrathin copper layer are formed by sputtering. Both Patent Documents 2 and 3 achieve a significantly low arithmetic average roughness Ra of 1.0 to 100 nm of the outer face of the ultrathin copper layer through formation of the layers on the carrier composed of, for example, glass with superior coplanarity by sputtering.

For example, the laminate of the carrier and the copper layer may come into contact with a certain member during transfer of the carrier-attached copper foil, resulting in unexpected separation of the copper layer. Some copper foils with carriers have been proposed that can address such a problem. For example, Patent Document 4 (JP2016-137727A) discloses a laminate including a metal carrier and a metal foil, where the partial or entire outer peripheries of the metal carrier and the metal foil are covered with resin. Such a configuration can prevent the copper foil from coming into contact with a certain member to reduce separation of the metal foil during handling of the laminate. Patent Document 5 (WO2014/054812) discloses a metal foil with a carrier, where the interface between the resin carrier and the metal foil are strongly bonded with an adhesive layer in at least four corners of the outer periphery to prevent unexpected separation at the corners. Patent Document 5 also discloses that the transferred metal foil with the carrier is cut at the inner part inside the region of the adhesive layer. Patent Document 6 (JP2000-331537A) discloses a carrier-attached copper foil, where the right and left edge regions of the carrier have a higher surface roughness than the central region, thereby preventing troubles, for example, separation of a copper layer of the copper foil from the carrier during handling of the carrier-attached copper foil or production of a copper-clad laminate.

CITATION LIST

Patent Literature

Patent Document 1: JP2005-76091A
Patent Document 2: WO2017/150283
Patent Document 3: WO2017/150284
Patent Document 4: JP2016-137727A
Patent Document 5: WO2014/054812
Patent Document 6: JP2000-331537A

SUMMARY OF INVENTION

The dimensions of a substrate that can be processed with a mounting system have upper limits for mounting, for example, an IC chip onto the substrate. A typical carrier-attached copper foil has dimensions of, for example, 400 mm by 400 mm, which exceeds the upper limits. Thus, the carrier-attached copper fail is cut into a size that can be processed by a mounting equipment, for example, a width of about 100 mm. Unfortunately, the release layer exposed at the cut interface of the carrier-attached copper foil may have low release strength and the copper layer may be separated from the carrier by a load occurring during the cutting of the carrier-attached copper foil. As a result, no intended circuit pattern can be formed, so that the process cannot proceed to the subsequent step. In the case that a glass carrier is used, a defect, for example, chipping is likely to occur at edges of the glass carrier during cutting of the carrier-attached copper foil.

Regarding a glass carrier-attached copper foil, the present inventors have discovered that, by defining a linear rough region serving as a cutting margin on the substantially flat surface of the glass carrier, it is possible to achieve a desired circuit mounting board that reduces separation of the copper layer at the cut edge even if the copper foil is downsized, and has an intended circuit pattern with a fine pitch.

An object of the present invention is to provide a glass carrier-attached copper foil capable of achieving a desired circuit mounting board that reduces separation of the copper layer at the cut edge even if the copper foil is downsized to dimensions enabling mount of a circuit, and has an intended circuit pattern with a fine pitch.

According to an aspect of the present invention, there is provided a glass carrier-attached copper foil, comprising:
 a glass carrier;
 a release layer provided on the glass carrier; and
 a copper layer provided on the release layer and having a thickness of 0.1 to 3.0 µm,
 wherein the glass carrier has, at least on its surface having the copper layer thereon, a plurality of flat regions each having a maximum height Rz of less than 1.0 µm as measured in accordance with JIS B 0601-2001; and a rough region having a maximum height Rz of 1.0 to 30.0 µm as measured in accordance with JIS B 0601-2001, the rough region having a pattern of lines that define the flat regions.

According to another aspect of the present invention, there is provided a method of producing the glass carrier-attached copper foil, comprising the steps of:

providing a glass carrier at least one surface of which is a flat face with a maximum height Rz of less than 1.0 µm as measured in accordance with JIS B 0601-2001;

roughening a predetermined region of the surface of the glass carrier to form a rough region having a pattern of lines that define a plurality of unprocessed regions, the rough region having a maximum height Rz of 1.0 to 30.0 µm as measured in accordance with JIS B 0601-2001;

forming a release layer on the glass carrier; and forming a copper layer having a thickness of 0.1 to 3.0 µm on the release layer.

In the following description in this specification, the maximum height Rz as measured in accordance with JIS B 0601-2001 is simply referred to as "maximum height Rz" or merely "Rz".

DESCRIPTION OF EMBODIMENTS

Glass Carrier-Attached Copper Foil

Figure 1:
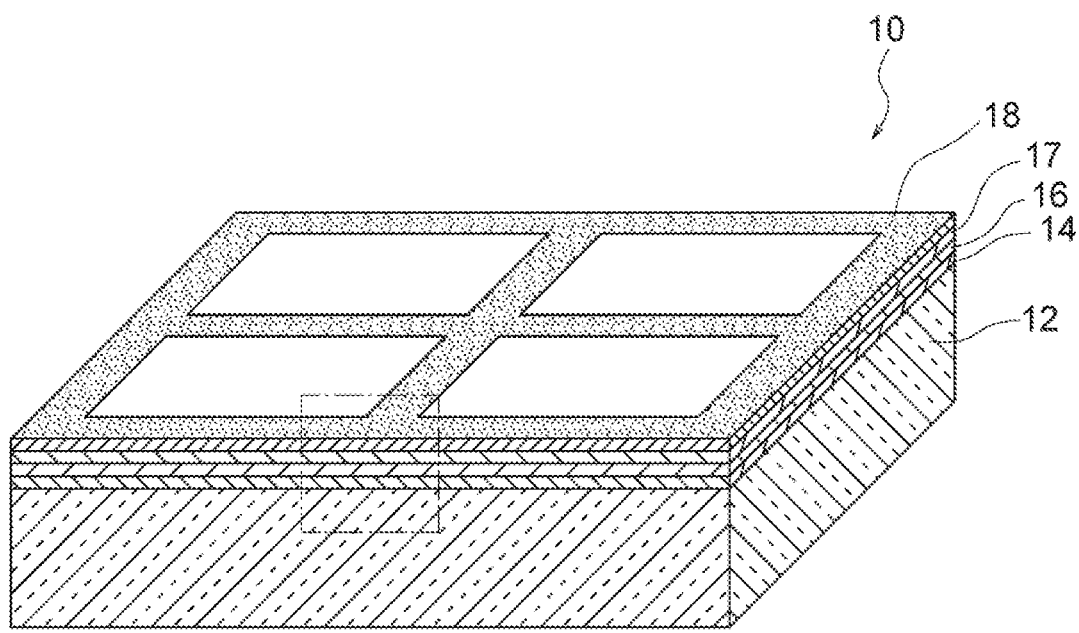
FIG. 1 is a schematic perspective view illustrating an embodiment of a glass carrier-attached copper foil according to the present invention.
Figure 2:
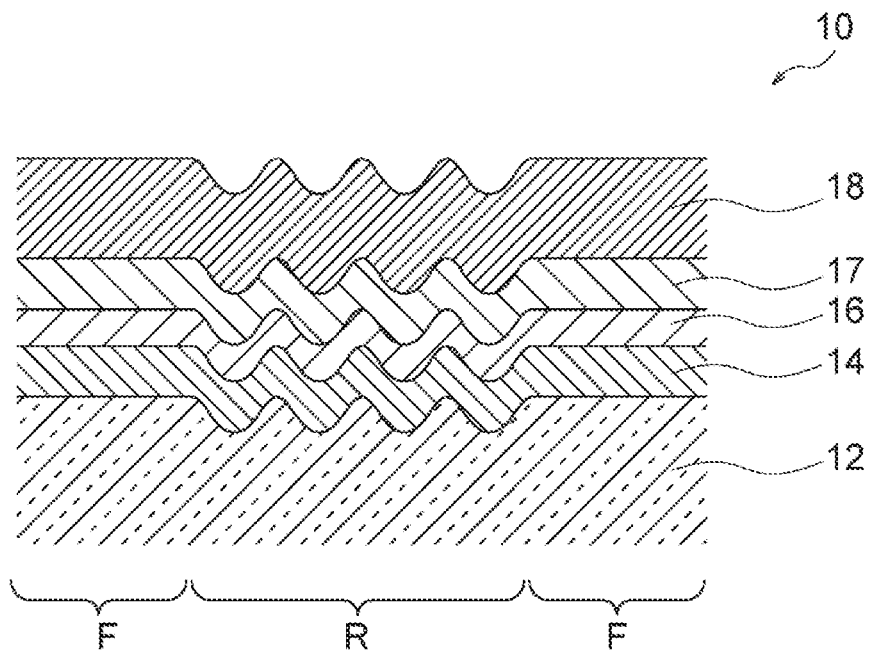
FIG. 2 is a schematic cross-sectional view illustrating a layer configuration of a portion, surrounded by a dotted line, of the glass carrier-attached copper foil in FIG. 1.
Figure 3:
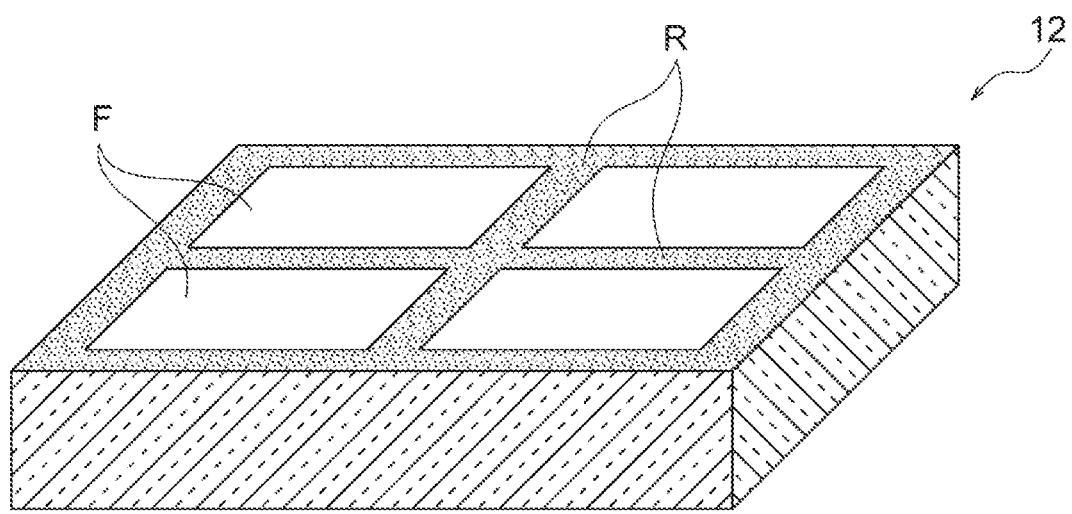
FIG. 3 is a schematic perspective view illustrating the glass carrier of the glass carrier-attached copper foil in FIG. 1.

FIGS. 1 and 2 schematically illustrate an exemplary glass carrier-attached copper foil of the present invention. As illustrated in FIGS. 1 and 2, the glass carrier-attached copper foil 10 of the present invention includes, in sequence, a glass carrier 12, a release layer 16, and a copper layer 18. The release layer 16 is provided on the glass carrier 12. The copper layer 18 is provided on the release layer 16 and has a thickness of 0.1 to 3.0 µm. The glass carrier-attached copper foil 10 may further include an intermediate layer 14 between the glass carrier 12 and the release layer 16 as desired. The glass carrier-attached copper foil 10 may further include a functional layer 17 between the release layer 16 and the copper layer 18. In addition, the aforementioned layers may be provided in sequence on two sides of the glass carrier 12 so as to be symmetric about the glass carrier 12. The glass carrier-attached copper foil 10 may have any known layer configuration as long as the copper foil 10 includes the glass carrier 12 as described above. In any case, the glass carrier 12 has, at least on its surface having the copper layer 18 thereon, a plurality of flat regions F with a maximum height Rz of less than 1.0 µm and a rough region R with a maximum height Rz of 1.0 to 30.0 µm in the present invention, as illustrated in FIGS. 2 and 3. The rough region R has a pattern of lines that define discrete flat regions F.

Figure 4:
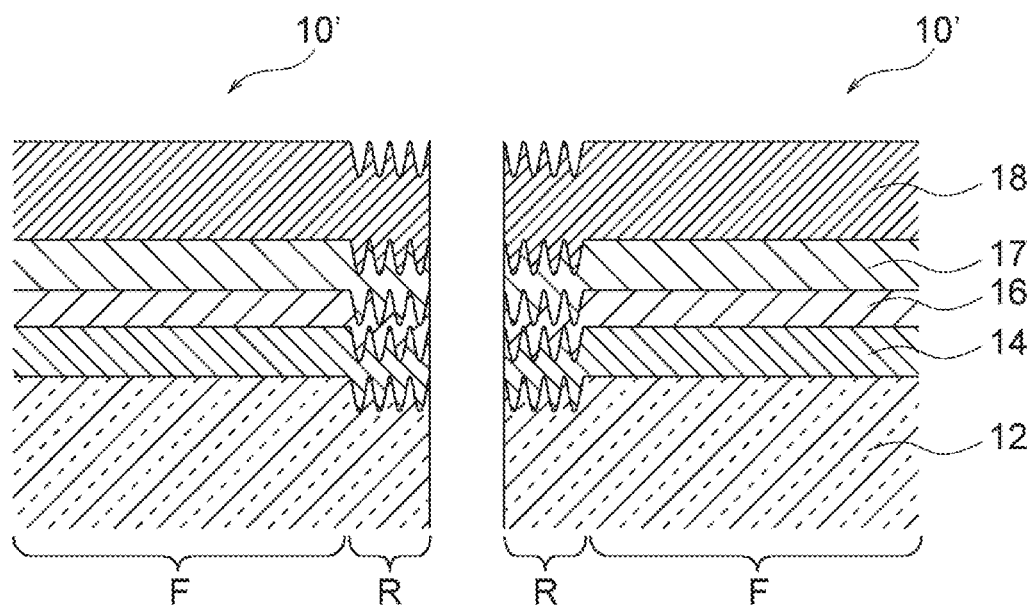
FIG. 4 is a schematic cross-sectional view illustrating the glass carrier-attached copper foil cut at a rough region.

In this manner, the linear rough region R serving as a cutting margin is defined on the substantially flat glass carrier 12 of the glass carrier-attached copper foil. A desired circuit mounting board can be thereby produced that reduces separation of the copper layer 18 at the cut edge even if the copper foil is downsized, and facilitates formation of an intended circuit pattern with a fine pitch. In other words, the glass carrier 12 having flat regions F with a low maximum height Rz generates a flat profile of the copper layer 18 stacked above the flat regions F of the glass carrier 12 with the release layer 16 therebetween. The flat face of the copper layer 18 enables formation of a fine pattern. The glass carrier 12 also has a rough region R with a high maximum height Rz. An anchor effect due to the asperities enhances the release strengths of portions, at the rough region R, of the release layer 16 and the copper layer 18. Since the rough region R of the glass carrier 12 has a pattern of lines that define discrete flat regions F, the glass carrier-attached copper foil 10 can be cut along the pattern of the rough region R into multiple glass carrier-attached copper foils 10' each having the flat region F and downsized to dimensions processable with a mounting system. FIG. 4 shows the glass carrier-attached copper foils 10' produced by cutting at the rough region R. Since the glass carrier-attached copper foils 10' each have a cut plane at the rough region R as illustrated in FIG. 4, the release layer 16 at the cut plane has a high release strength. Thus, undesired separation of the copper layer 18 from the cut plane can be quite effectively prevented during and after the cutting process (for example, during transfer or handling of the carrier-attached copper foil in a mounting process). As a result, formation of an intended circuit pattern is facilitated and a desired circuit mounting board with a fine pitch can be achieved.

In the glass carrier-attached copper foil 10 of the present invention, the rough region R is preferably designed to be cut along the predetermined pattern such that the glass carrier-attached copper foil 10 is divided into multiple pieces. In other words, the glass carrier-attached copper foil 10 of the present invention is preferably cut along the predetermined pattern of the rough region R into multiple pieces in the case that downsizing of the copper foil is required for mount of a circuit. The glass carrier-attached copper foil 10 may be cut by any known technique. Examples of the preferred cutting means include dice cutters, water jet cutters, and laser cutters.

The glass carrier 12 is composed of glass. The glass carrier 12 may be in the form of a sheet, a film, or a plate. The glass carrier 12 may be a laminate of such sheets, films, or plates. For example, the glass carrier 12 preferably serves as a rigid support, for example, a glass plate. The glass carrier is more preferably composed of a glass material that has a coefficient of thermal expansion (CTE) of less than 25 ppm/K (typically 1.0 to 23 ppm/K) from the viewpoint of prevention of warping of the glass carrier-attached copper foil 10 in a process involving heating. From the viewpoint of ensuring of handling and planarization of the glass carrier during mounting of a chip, the glass carrier 12 preferably has a Vickers hardness of 100 HV or more, more preferably 150 to 2500 HV. The carrier composed of glass has a low weight, a low coefficient of thermal expansion, and high insulation properties, high rigidity, and surface flatness, and thus is advantageous in that the face of the copper layer 18 can be significantly planarized. The carrier composed of glass has other advantages, for example, superior visibility of a copper plating in the image inspection after formation of a wiring layer; coplanarity that is beneficial to mounting of a circuit device; chemical resistance in desmearing and various plating in a manufacturing process of a printed circuit board; and employment of a chemical separation process during release of the glass carrier 12 from the glass carrier-attached copper foil 10. The glass carrier 12 is preferably made of a glass containing $SiO_2$, more preferably 50 wt % or more $SiO_2$, further preferably 60 wt % or more $SiO_2$. Preferred examples of the glass constituting the glass carrier 12 include fused quartz, borosilicate glass, alkali-free glass, soda-lime glass, aminosilicate glass, and combination thereof. More preferred examples of the glass include borosilicate glass, alkali-free glass, soda-lime glass, and combination thereof. Particularly preferred examples of the glass include alkali-free glass, soda-lime glass, and combination thereof. The most preferred glass is alkali-free glass. The glass carrier 12 is preferably composed of borosilicate glass, alkali-free glass, or soda-lime glass because chipping of the glass carrier 12 can be reduced during cutting of the glass carrier-attached copper foil 10. Alkali-free glass is composed essentially of silica dioxide, aluminum oxide, boric oxide, and alkaline-earth metal oxide, such as calcium oxide or barium oxide, and further contains boron. Thus, the alkali-free glass substantially contains no alkali metal. The alkali-free glass has a coefficient of thermal expansion that ranges from 3 to 5 ppm/K in a wide temperature range of 0° C. to 350° C. and is low and stable. Thus, the alkali-free glass has an advantage of minimization of warpage of glass in a process involving heating. The glass carrier 12 preferably has a thickness of 100 to 2000 μm, more preferably 300 to 1800 μm, further preferably 400 to 1100 μm. A thickness in such a range can ensure an appropriate toughness that does not preclude handling of the carrier 22 while achieving thinning of a printed circuit board and a reduction in warpage of the carrier 22 during packaging of an electronic component.

The flat regions F of the glass carrier 12 each have a maximum height Rz of less than 1.0 μm, preferably 0.001 to 0.5 μm, more preferably 0.001 to 0.1 μm, further preferably 0.001 to 0.08 μm, particularly preferably 0.001 to 0.05 μm, most preferably 0.001 to 0.02 μm. In this way, a lower maximum height Rz of the flat region F can yield a desired low maximum height Rz of the outer face of the copper layer 18 stacked above the glass carrier 12 (in other words, the face remote from the release layer 16). Thus, a printed circuit board produced from the glass carrier-attached copper foil 10 is more suitable for formation of a highly fine wiring pattern having a line (L) of 13 μm or less and a space (S) of 13 μm or less (for example, a line (L) ranging from 12 to 2 μm and a space (S) ranging from 12 to 2 μm).

The rough region R of the glass carrier 12 has a maximum height Rz of 1.0 to 30.0 μm, preferably 1.5 to 28.0 μm, more preferably 2.0 to 26.0 μm, further preferably 2.5 to 24.0 μm, particularly preferably 5.0 to 22.0 μm, most preferably 10.0 to 20.0 μm. Adhesion of the glass carrier 12 to the release layer 16 at the rough region R can be thereby enhanced. Thus, a satisfactory release strength of the release layer 16 at the cut plane can be ensured during cutting of the glass carrier-attached copper foil 10 along the pattern of the rough region R and undesired separation of the copper layer 18 due to cutting can be more effectively prevented. In addition, pointed portions or cracks are unlikely to be produced on the glass carrier 12. Thus, the number of granular glass fragments produced during cutting of the glass carrier-attached copper foil 10 can be reduced. The glass carrier 12 at the rough region R has a release strength of preferably 30 to 3000 gf/cm, more preferably 50 to 2800 gf/cm, further preferably 200 to 2500 gf/cm, particularly preferably 400 to 2300 gf/cm, most preferably 1000 to 2000 gf/cm. As will be mentioned below in Examples, the release strength is measured in accordance with JIS Z 0237-2009.

The rough region R preferably has a lattice pattern, a fence pattern, or a cruciform pattern because the plurality of flat regions F can have equal forms and sizes suitable for a circuit mounting board. The rough region R particularly preferably has a lattice or fence pattern. This enables the rough region R to surround the entire or most peripheries of the discrete flat regions F. Thus, separation is unlikely to occur at edges of each glass carrier-attached copper foil 10' after being cut and then divided.

The pattern of the rough region R preferably has a line width of 1 to 50 mm, more preferably 1.5 to 45 mm, further preferably 2.0 to 40 mm, particularly preferably 2.5 to 35 mm. The line width in such a range can facilitate positioning of a cutting machine, for example, a cutter, onto the rough region R to cut the rough region R, increase the areas of the flat regions F, and keep desirable advantages of the rough region R can be achieved.

In order to sufficiently ensure the regions that imparts flatness required for formation of a fine pattern to the copper layer 18 (in other words, the flat regions F), the ratio of the area of the rough region R of the glass carrier 12 to the total area of the flat regions F and the rough region R of the glass carrier 12 is preferably 0.01 to 0.5, more preferably 0.02 to 0.45, further preferably 0.05 to 0.40, most preferably 0.1 to 0.35.

The intermediate layer 14, which is provided as desired, intervenes between the carrier 12 and the release layer 16 and contributes to the tight adhesion between the carrier 12 and the release layer 16. Examples of the metal constituting the intermediate layer 14 include Cu, Ti, Al, Nb, Zr, Cr, W, Ta, Co, Ag, Ni, In, Sn, Zn, Ga, Mo, and combination thereof (hereinafter referred to as metal M), preferably Cu, Ti, Al, Nb, Zr, Cr, W, Ta, Co, Ag, Ni, Mo, and combination thereof, more preferably Cu, Ti, Zr, Al, Cr, W, Ni, Mo, and combination thereof, further preferably Cu, Ti, Al, Cr, Ni, Mo, and combination thereof, particularly preferably Cu, Ti, Al, Ni, and combination thereof. The intermediate layer 14 may be composed of an elemental metal or an alloy. The metal constituting the intermediate layer 14 may contain incidental impurities originated from, for example, components contained in a material and formed during a process for formation of the layer. After formation and subsequent exposure of the intermediate layer 14 to air, atmospheric oxygen may be incorporated into the intermediate layer 14. The content of the metal may have any upper limit and may be 100 at %. The intermediate layer 14 is preferably formed by physical vapor deposition (PVD), more preferably by sputtering. A particularly preferred intermediate layer 14 is formed by magnetron sputtering using a metal target to improve the uniformity of the thickness of the intermediate layer 14. The intermediate layer 14 preferably has a thickness of 10 to 1000 nm, more preferably 30 to 800 nm, further preferably 60 to 600 nm, particularly preferably 100 to 400 nm. The thickness is determined by cross-sectional observation of the intermediate layer 14 with a transmission electron microscope provided with an energy dispersive X-ray spectroscopic analyzer (TEM-EDX).

The intermediate layer 14 may have a monolayer configuration or a multilayer configuration. In the case that the intermediate layer 14 has a monolayer configuration, the intermediate layer 14 is preferably a metal-containing layer composed of Cu, Al, Ti, Ni, or combination thereof (for example, an alloy or an intermetallic compound), more preferably composed of Al, Ti, or combination thereof (for example, an alloy or an intermetallic compound), further preferably a layer mainly containing Al or a layer mainly containing Ti. In the case that the intermediate layer 14 is composed of a metal or an alloy having insufficient adhesion to the glass carrier 12, the intermediate layer 14 preferably has a bilayer configuration. In other words, one sublayer composed of a metal (for example, Ti) or an alloy having high adhesion to the glass carrier 12 adjoins the glass carrier 12 and another sublayer composed of a metal (for example, copper) or an alloy having low adhesion to the glass carrier 12 adjoins the release layer 16, resulting in improved adhesion to the glass carrier 12. Thus, an exemplary bilayer configuration of the intermediate layer 14 has a laminate structure consisting of a Ti-containing sublayer adjoining the glass carrier 12 and a Cu-containing sublayer adjoining the release layer 16. Since a variation in the proportion of the constituent elements in or the thicknesses of the two sublayers leads to a variation in the release strength, it is preferred to appropriately adjust the proportion of the constituent elements in or the thickness of each sublayer. Throughout this specification, the category of "layers containing the metals M" includes layers composed of alloys containing other elements in addition to the metals M in an amount that does not impair the releasability of the carrier. In other words, the intermediate layer 14 mainly contains a metal M. From this viewpoint, the content of the metal M in the intermediate layer 14 is preferably 50 to 100 at %, more preferably 60 to 100 at %, further preferably 70 to 100 at %, particularly preferably 80 to 100 at %, most preferably 90 to 100 at %.

In the case that the intermediate layer 14 is composed of an alloy, a preferred example of the alloy is a Ni alloy. The Ni content in the Ni alloy is preferably 45 to 98 wt %, more preferably 55 to 90 wt %, further preferably 65 to 85 wt %. The Ni alloy is preferably composed of Ni and at least one element selected from the group consisting of Cr, W, Ta, Co, Cu, Ti, Zr, Si, C, Nd, Nb, and La, more preferably Ni and at least one element selected from the group consisting of Cr, W, Cu, and Si. In the case that the intermediate layer 14 is composed of a Ni alloy, it is particularly preferred to form an intermediate layer 14 by magnetron sputtering using a Ni alloy target because the intermediate layer can have a more uniform thickness.

The release layer 16 enables release of the glass carrier 12 and may be composed of a known material used in a release layer of a typical carrier-attached copper foil. The release layer 16 may be organic or inorganic. Examples of the organic component used in the organic release layer include nitrogen-containing organic compounds, sulfur-containing organic compounds, and carboxylic acid. Examples of the nitrogen-containing organic compounds include triazole compounds and imidazole compounds. Examples of the inorganic component used in the inorganic release layer include oxides of at least one metal selected from the group consisting of Ni, Mo, Co, Cr, Fe, Ti, W, P, Zn, Cu, Al, Nb, Zr, Ta, Ag, In, Sn, and Ga, and carbon. Among them, the release layer 16 is preferably a carbon layer, i.e., a layer mainly containing carbon from the viewpoint of releasability and film formability, more preferably a layer mainly composed of carbon or hydrocarbon, further preferably a hard carbon layer composed of amorphous carbon. In this case, the carbon content in the release layer 16 (in other words, the carbon layer) is preferably 60 at % or more, more preferably 70 at % or more, further preferably 80 at % or more, particularly preferably 85 at % or more, as measured by X-ray photoelectron spectroscopy (XPS). The carbon content may have any upper limit, for example, 100 at % and is practically 98 at % or less. The release layer 16 (in particular, the carbon layer) may contain incidental impurities (for example, oxygen and hydrogen originated from an ambient environment, such as an atmosphere). Metal atoms originated from a process for formation of the functional layer 17 or the copper layer 18 may be incorporated into the release layer 16 (in particular, the carbon layer). Carbon is less diffusible to and less reactive with the carrier. Even during a high-temperature press process above 300° C., the release layer 16 can prevent formation of a metallic bond between the copper foil and a bonded interface and keep the carrier readily releasable. A preferred release layer 16 is also formed by a gas-phase process, for example, by sputtering to suppress incorporation of excess incidental impurities in amorphous carbon and to keep continuous formation of the intermediate layer 14 provided as desired. The release layer 16 (in particular, the carbon layer) preferably has a thickness of 1 to 20 nm, more preferably 1 to 10 nm. The thickness is determined by cross-sectional observation of the release layer 16 with a transmission electron microscope provided with an energy dispersive X-ray spectroscopic analyzer (TEM-EDX).

The functional layer 17 may be provided between the release layer 16 and the copper layer 18 as desired. The functional layer 17 may be any layer imparting a desired function, for example, an etching stopping function or an antireflective function to the glass carrier-attached copper foil 10. Preferred examples of a metal constituting the functional layer 17 include Ti, Al, Nb, Zr, Cr, W, Ta, Co, Ag, Ni, Mo, and combination thereof. More preferred are Ti, Zr, Al, Cr, W, Ni, Mo, and combination thereof. Further preferred are Ti, Al, Cr, Ni, Mo, and combination thereof. Particularly preferred are Ti, Mo, and combination thereof. These elements are insoluble in a copper flash etching solution, resulting in a high chemical resistance against the copper flash etching solution. Thus, the functional layer 17 is less etched by the copper flash etching solution than the copper layer 18 and can thus serve as an etching stopper layer. Since the aforementioned metal constituting the functional layer 17 can prevent light reflection, the functional layer 17 can serve as an antireflective layer to enhance visibility in an image inspection (for example, an automated optical inspection (AOI)). The functional layer 17 may be composed of an elemental metal or an alloy. The metal constituting the functional layer 17 may contain incidental impurities originated from, for example, components contained in a material and formed during a process for formation of the layer. The content of the metal may have any upper limit, for example, 100 at %. The functional layer 17 may be preferably formed by physical vapor deposition (PVD), more preferably by sputtering. The functional layer 17 preferably has a thickness of 1 to 500 nm, more preferably 10 to 400 nm, further preferably 30 to 300 nm, particularly preferably 50 to 200 nm.

The copper layer 18 is composed of copper. The copper layer 18 may contain incidental impurities originated from, for example, components contained in a material and formed during a process for formation of the layer. The copper layer 18 may be produced by any process, for example, a wet process, such as electroless copper plating or electrolytic copper plating, a physical vapor deposition (PVD), such as sputtering or vacuum vapor deposition, a chemical vapor deposition, or combination thereof. A particularly preferred copper layer is formed by physical vapor deposition (PVD), such as sputtering or vacuum vapor deposition, to achieve a fine pitch through thinning of the copper foil. Most preferred is a copper layer formed by sputtering. The copper layer 18 is preferably unroughened. Alternatively, the copper layer may be roughened by preliminary roughening, soft etching, washing, or oxidation-reduction within a scope not precluding the formation of a wiring pattern during manufacturing of a printed circuit board. In order to achieve a fine pitch described above, the copper layer 18 has a thickness of 0.05 to 3.0 μm, preferably 0.10 to 2.5 μm, more preferably 0.15 to 2.0 μm, further preferably 0.20 to 1.5 μm, particularly preferably 0.25 to 1.25 μm, most preferably 0.28 to 1.0 μm. The copper layer 18 having a thickness in such a range is preferably formed by sputtering from the viewpoint of the uniformity of the thickness of the formed layer and production of a sheeted or rolled copper foil.

The outer face of the copper layer 18 preferably has a flat profile corresponding to the surface profile of the flat regions F of the glass carrier 12 and a rough profile corresponding to the surface profile of the rough region R of the glass carrier 12. As illustrated in FIGS. 1 and 2, the glass carrier 12, which has the flat regions F and the rough region R, is provided with the intermediate layer 14 (if present), the release layer 16, the functional layer 17 (if present), and the copper layer 18. The surface profiles of the flat regions F and the rough region R of the glass carrier 12 are transferred to the faces of each layer. In this way, desired surface profiles corresponding to those of the respective regions of the glass carrier 12 are preferably imparted to the outer face of the copper layer 18. This can more effectively prevent separation of the copper layer 18 in the case of cutting the glass carrier-attached copper foil 10 and more effectively achieve a fine pitch. The face with a flat profile, (namely a flat face,) corresponding to the flat regions F of the glass carrier 12, on the outer face of the copper layer 18 typically has a maximum height Rz of less than 1.0 μm, preferably 0.001 to 0.5 μm, more preferably 0.001 to 0.1 μm, further preferably 0.001 to 0.08 μm, particularly preferably 0.001 to 0.05 μm, most preferably 0.001 to 0.02 μm. The face with a rough profile, (namely a rough face,) corresponding to the rough region R of the glass carrier 12, on the outer face of the copper layer 18 typically has a maximum height Rz of 1.0 to 30.0 μm, preferably 1.5 to 28.0 μm, more preferably 2.0 to 26.0 μm, further preferably 2.5 to 24.0 μm, particularly preferably 5.0 to 22.0 μm, most preferably 10.0 to 20.0 μm.

The intermediate layer 14 (if present), the release layer 16, the functional layer 17 (if present), and the copper layer 18 are preferably films formed by physical vapor deposition (PVD), more preferably formed by sputtering.

Method of Producing Glass Carrier-Attached Copper Foil

The glass carrier-attached copper foil 10 of the present invention is produced by (1) providing a glass carrier, (2) roughening a predetermined region on the glass carrier, and (3) forming layers, such as, a release layer and a copper layer, on the glass carrier.

(1) Providing Glass Carrier

A glass carrier 12 is provided that has at least one face with a maximum height Rz of less than 1.0 μm. The maximum height Rz is preferably 0.001 to 0.5 μm, more preferably 0.001 to 0.1 μm, further preferably 0.001 to 0.08 μm, particularly preferably 0.001 to 0.05 μm, most preferably 0.001 to 0.02 μm. Since glass products usually have high flatness, a commercially available glass sheet, film, or plate that satisfies the maximum height Rz within such a range may be used as a glass carrier 12. Alternatively, the glass carrier 12 that does not satisfy the maximum height Rz within the range may be subjected to a known surface polishing process to achieve a maximum height Rz within the range. The preferred materials and properties of the glass carrier 12 have been described above.

(2) Roughening Face of Glass Carrier

A predetermined region on the glass carrier 12 is roughened to form a rough region R that has a maximum height Rz of 1.0 to 30.0 μm and a pattern of lines defining a plurality of discrete regions. The maximum height Rz is preferably 1.1 to 20.0 μm, more preferably 1.2 to 15.0 μm, further preferably 1.3 to 10.0 μm, particularly preferably 1.4 to 7.0 μm, most preferably 1.5 to 5.0 μm. Roughening may be carried out by any known process such that the maximum height Rz within the range described above can be achieved and the rough region R having a desired pattern can be formed (masking may also be carried out as required). Preferred roughening processes are abrasive blasting and etching, which can efficiently form a rough region R having a desired Rz. Abrasive blasting is more preferred. A roughening process involving abrasive blasting can be carried out by projecting particulate blasting media onto a predetermined region (in other words, an area in which the rough region R should be formed) on the glass carrier 12 from a nozzle. The aperture of the nozzle has a diameter of preferably 0.5 to 10.0 mm, more preferably 0.75 to 8.5 mm. The media have a diameter of preferably 1.0 to 1000 μm, more preferably 2.0 to 800 mm. The media are projected at a rate of preferably 10 to 3000 g/minute, more preferably 25 to 2750 g/minute. The discharge pressure is preferably 0.005 to 0.5 MPa, more preferably 0.01 to 0.1 MPa. Preferred examples of materials for the media include alumina, zirconia, silicon carbide, iron, aluminum, zinc, glass, steel, and boron carbide. The media have a Mohs hardness of preferably 4 or more, more preferably 5.5 or more, further preferably 6.0 or more. Meanwhile, preferred examples of the roughening process involving etching include wet processes using hydrofluoric acid solution and dry processes involving reactive ion etching (RIE) using process gases containing florine (for example, $CF_4$ and $SF_6$).

Figure 5:
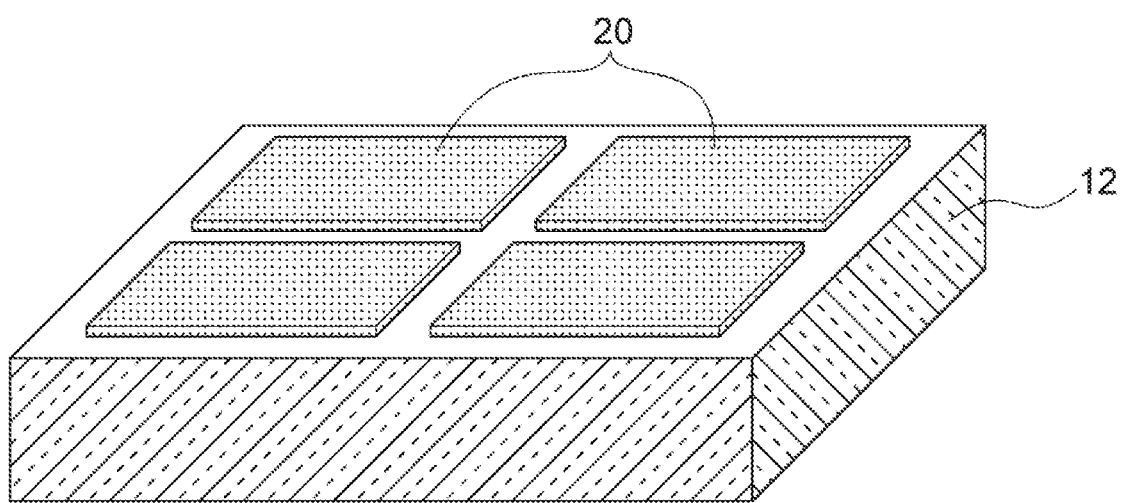
FIG. 5 is a schematic top view illustrating a glass carrier provided with a masking layer.

For selective roughening (in particular, involving abrasive blasting or etching) of a desired region, masking is preferably employed. In detail, a masking layer 20 is preferably formed in the regions other than the predetermined region (in other words, the area in which the rough region R should be formed) on the glass carrier 12 before the roughening process, as illustrated in FIG. 5. In this case, it is preferred to remove the masking layer 20 after the roughening process. Although the masking layer is preferably formed in the case of the roughening process involving etching, the masking layer may be formed also in the case of the roughening process involving abrasive blasting as required.

(3) Forming Layers on Glass Carrier

The roughened glass carrier 12 is provided with an intermediate layer 14 as desired, a release layer 16, a functional layer 17 as desired, and a copper layer 18 having a thickness of 0.1 to 3.0 μm. Each of the intermediate layer 14 (if present), the release layer 16, the functional layer 17 (if present), and the copper layer 18 is preferably formed by physical vapor deposition (PVD) from the viewpoint of achieving a fine pitch through thinning of the copper foil. Examples of the physical vapor deposition (PVD) include sputtering, vacuum vapor deposition, and ion plating. The sputtering process is most preferred from the viewpoint of, for example, control of the thickness of a film in a wide range, such as 0.05 to 5000 nm, and ensuring a uniform thickness of the film over a large width or area. In particular, formation of all the intermediate layer 14 (if present), the release layer 16, the functional layer 17 (if present), and copper layer 18 by sputtering significantly enhances production efficiency. The film may be formed by any physical vapor deposition (PVD) process with a known vapor deposition system under known conditions. For example, any known sputtering process, such as magnetron sputtering, two-electrode sputtering, or facing target sputtering, may be employed. The magnetron sputtering is preferred because it has a high deposition rate and a high productivity. The sputtering process may be carried out with either direct-current (DC) power or radio-frequency (RF) power. The target may be, for example, a well-known plate target. From the viewpoint of efficiency of use, a cylindrical target is preferably used. Formation of the intermediate layer 14 (if present), the release layer 16, the functional layer 17 (if present), and the copper layer 18 by physical vapor deposition (PVD) (preferably by sputtering) will now be described.

In the PVD, the intermediate layer 14 is preferably formed by magnetron sputtering under a non-oxidizing atmosphere using a target composed of at least one metal selected from the group consisting of Cu, Ti, Al, Nb, Zr, Cr, W, Ta, Co, Ag, Ni, In, Sn, Zn, Ga, and Mo because the intermediate layer 14 has a highly uniform thickness. The target preferably has a purity of at least 99.9%. The gas used in the sputtering process is preferably an inert gas, for example, gaseous argon. Any flow rate of the gaseous argon may be appropriately determined depending on the volume of a sputtering chamber and the conditions for formation of a film. A pressure ranging from 0.1 to 20 Pa is preferably applied during formation of the film to keep continuous formation of the film without operational failure of the vapor deposition system, such as abnormal electric discharge or defective plasma radiation. The pressure range may be determined by adjustments of the deposition power and the flow rate of the gaseous argon depending on, for example, the structure and capacity of the system, the evacuation capacity of the vacuum pump, and the rating capacity of the deposition power. The sputtering power may be appropriately determined within a range of 0.05 to 10.0 W/cm$^2$ per unit area of the target in view of, for example, the uniformity of the thickness of the film and the productivity of formation of the film.

The release layer 16 is preferably formed by physical vapor deposition (PVD) (preferably by sputtering) using a carbon target under an inert atmosphere, for example, an argon atmosphere. The carbon target is preferably composed of graphite that may contain incidental impurities (for example, oxygen and carbon originated from an ambient environment, such as an atmosphere). The carbon target preferably has a purity of at least 99.99%, more preferably at least 99.999%. A pressure ranging from 0.1 to 2.0 Pa is preferably applied during formation of a film to keep continuous formation of the film without operational failure of the vapor deposition system, such as abnormal electric discharge or defective plasma radiation. The pressure range may be determined by adjustments of the deposition power and the flow rate of the gaseous argon depending on, for example, the structure and capacity of the system, the evacuation capacity of the vacuum pump, and the rating capacity of the deposition power. The sputtering power may be appropriately determined within a range of 0.05 to 10.0 W/cm$^2$ per unit area of the target in view of, for example, the uniformity of the thickness of the film and the productivity of formation of the film.

In the PVD, the functional layer 17 is preferably formed by magnetron sputtering using a target composed of at least one metal selected from the group consisting of Ti, Al, Nb, Zr, Cr, W, Ta, Co, Ag, Ni, and Mo. The target preferably has a purity of at least 99.9%. In particular, the functional layer 17 is preferably formed by magnetron sputtering under an inert gas atmosphere, for example, an argon atmosphere under a pressure of 0.1 to 20 Pa. The sputtering pressure is more preferably 0.2 to 15 Pa, further preferably 0.3 to 10 Pa. The pressure range may be determined by adjustments of the deposition power and the flow rate of the gaseous argon depending on, for example, the structure and capacity of the system, the evacuation capacity of the vacuum pump, and the rating capacity of the deposition power. Any flow rate of the gaseous argon may be appropriately determined depending on the volume of the sputtering chamber and the conditions for formation of a film. The sputtering power may be appropriately determined within a range of 1.0 to 15.0 W/cm$^2$ per unit area of the target in view of, for example, the uniformity of the thickness of the film and the productivity of formation of the film. The temperature of the carrier is preferably kept constant during formation of the film for achievement of uniform properties of the film (for example, the uniform resistance and crystal size of the film). The temperature of the carrier during formation of the film is preferably adjusted within a range of 25 to 300° C., more preferably 40 to 200° C., further preferably 50 to 150° C.

The copper layer 18 is preferably formed by physical vapor deposition (PVD) (preferably by sputtering) using a copper target under an inert atmosphere, for example, an argon atmosphere. The copper target is preferably composed of elemental copper that may contain incidental impurities. The copper target preferably has a purity of at least 99.9%, more preferably at least 99.99%, further preferably at least 99.999%. In order to prevent an increase in temperature during formation of the copper layer 18 by physical vapor deposition, a mechanism may be provided for cooling the stage in the vapor deposition system. A pressure ranging from 0.1 to 2.0 Pa is preferably applied during formation of a film to keep continuous formation of the film without operational failure of the vapor deposition system, such as abnormal electric discharge or defective plasma radiation. The pressure range may be determined by adjustments of the deposition power and the flow rate of the gaseous argon depending on, for example, the structure and capacity of the system, the evacuation capacity of the vacuum pump, and the rating capacity of the deposition power. The sputtering power may be appropriately determined within a range of 0.05 to 10.0 W/cm$^2$ per unit area of the target in view of, for example, the uniformity of the thickness of the film and the productivity of formation of the film.

EXAMPLES

The present invention will now be described in more detail by the following Examples.

Example 1

With reference to FIG. 1, a rough region R was formed on a glass carrier 12. Subsequently, an intermediate layer 14 (including a Ti-containing sublayer and a Cu-containing sublayer), a carbon layer as a release layer 16, a functional layer 17, and a copper layer 18 were formed in sequence on the glass carrier 12 to produce a glass carrier-attached copper foil 10. The procedures will be detailed below. It should be noted that the maximum height Rz to be mentioned in the following Examples is measured in accordance with JIS B 0601-2001 with a non-contact surface profiler (NewView 5032 available from Zygo Corporation).

(1) Providing Glass Carrier

A glass sheet was provided that had a flat face with a maximum height Rz of 2.7 nm, dimensions of 200 mm by 250 mm, and a thickness of 1.1 mm (material: soda-lime glass available from Central Glass Co., Ltd.).

(2) Roughening Glass Carrier

As illustrated in FIG. 5, a masking layer 20 was formed on the glass carrier 12. The masking layer 20 had a pattern with four rectangular masked regions spaced apart from each other by lines with an average width of 2.5 mm. The masking layer 20 was formed by roll lamination using a photosensitive film. Particulate alumina media with a diameter of 0.16 mm were projected from a nozzle having an aperture with a diameter of 5 mm for 30 seconds under a discharge pressure of 0.05 MPa onto the glass carrier 12 partly covered with the masking layer 20 using a blower type of abrasive blasting machine (LDQ-3(AB) available from Fuji Manufacturing Co., Ltd.) to roughen the exposed portions of the glass carrier 12. The rough region R formed on the glass carrier 12 had a maximum height Rz of 1.0 μm and a lattice pattern of lines with an average width of 2.5 mm. The masking layer 20 was then removed to expose the flat regions F.

(3) Forming Ti-Containing Sublayer

A Ti-containing sublayer having a thickness of 100 nm was formed on the roughened face of the glass carrier 12 in a sputtering system under the following conditions:
  System: a single-wafer magnetron sputtering system (MLS464 available from Canon Tokki Corporation)
  Target: a Ti (purity: 99.999%) target with a diameter of 8 inches (203.2 mm)
  Ultimate vacuum: below $1 \times 10^{-4}$ Pa
  Carrier gas: Ar (flow rate: 100 sccm)
  Sputtering pressure: 0.35 Pa
  Sputtering power: 1000 W (3.1 W/cm$^2$)
  Deposition temperature: 40° C.

(4) Forming Cu-Containing Sublayer

A Cu-containing sublayer with a thickness of 100 nm was formed on the Ti-containing sublayer in a sputtering system under the following conditions:
  System: a single-wafer DC sputtering system (MLS464 available from Canon Tokki Corporation)
  Target: a copper (purity: 99.98%) target with a diameter of 8 inches (203.2 mm)
  Ultimate vacuum: below $1 \times 10^{-4}$ Pa
  Gas: gaseous argon (flow rate: 100 sccm)
  Sputtering pressure: 0.35 Pa
  Sputtering power: 1000 W (6.2 W/cm$^2$)
  Deposition temperature: 40° C.

(5) Forming Carbon Layer

A release layer 16 of amorphous carbon with a thickness of 6 nm was formed on the Cu-containing sublayer in a sputtering system under the following conditions:
  System: a single-wafer DC sputtering system (MLS464 available from Canon Tokki Corporation)
  Target: a carbon (purity: 99.999%) target with a diameter of 8 inches (203.2 mm)
  Ultimate vacuum: below $1 \times 10^{-4}$ Pa
  Carrier gas: Ar (flow rate: 100 sccm)
  Sputtering pressure: 0.35 Pa
  Sputtering power: 250 W (0.7 W/cm$^2$)
  Deposition temperature: 40° C.

(6) Forming Functional Layer

A functional layer 17 of a titanium having a thickness of 100 nm was formed on the release layer 16 in a sputtering system under the following conditions:
  System: a single-wafer DC sputtering system (MLS464 available from Canon Tokki Corporation)
  Target: a titanium (purity of 99.999%) target with a diameter of 8 inches (203.2 mm)
  Carrier gas: Ar (flow rate: 100 sccm)
  Ultimate vacuum: below $1 \times 10^{-4}$ Pa
  Sputtering pressure: 0.35 Pa
  Sputtering power: 1000 W (3.1 W/cm$^2$)

(7) Forming Ultrathin Copper Layer

A copper layer 18 having a thickness of 300 nm was formed on the functional layer 17 in a sputtering system under the following conditions, resulting in a copper foil 10 with a glass carrier:
  System: a single-wafer DC sputtering system (MLS464 available from Canon Tokki Corporation)
  Target: a copper (purity: 99.98%) target with a diameter of 8 inches (203.2 mm)
  Ultimate vacuum: below $1 \times 10^{-4}$ Pa
  Carrier gas: Ar (flow rate: 100 sccm)
  Sputtering pressure: 0.35 Pa
  Sputtering power: 1000 W (3.1 W/cm$^2$)
  Deposition temperature: 40° C.

(8) Measuring Release Strength of Rough Region

A glass carrier-attached copper foil having an entire rough side was formed as in Processes (1) to (7) except that the masking layer 20 was not formed. Copper was deposited to a thickness of 18 μm by electroplating on the copper layer of the glass carrier-attached copper foil to form a test sample. The release strength (gf/cm) at release of the electroplated copper layer from the sample was measured in accordance with JIS Z 0237-2009 under the conditions of a measured width of 10 mm, a measured length of 17 mm, and a releasing rate of 50 mm/minute. Table 1 shows the measured released strength of the rough region.

Examples 2 to 11

Glass carrier-attached copper foils 10 were prepared as in Example 1 except that the conditions of the abrasive blasting and/or the distances (line widths) between the spaced regions of the masking layer 20 were appropriately varied in the roughening process of the glass carrier 12 to modify a different maximum height Rz of the rough region R on the glass carrier 12 and/or a different average line width of the pattern. The release strength of the rough region was measured as in Example 1.

Evaluation

Each glass carrier-attached copper foil 10 according to Examples 1 to 11 was evaluated as shown below. Table 1 shows the results. Table 1 also shows the maximum height Rz, the release strength, and the average line width of the pattern of the rough region R on each glass carrier 12, and the ratio of the area of the rough region R to the total area of the flat regions F and the rough region R.

Evaluation 1: Number of Granular Fragments Produced by Cutting Rough Region

Each glass carrier-attached copper foil 10 was cut along the middles of widths of the lines of the pattern of the rough region with a dicing device. A region having an area of 10 cm$^2$ and including a cut end of the glass carrier-attached copper foil 10 was observed with a microscope. The number of granular fragments with a diameter of 20 μm or more produced by cutting was counted. The number of counted granular fragments was rated on following criteria:
Rating A: the number of granular fragments is less than 10
Rating B: the number of granular fragments is 10 or more and less than 50

Rating C: the number of granular fragments is 50 or more and less than 100
Rating D: the number of granular fragments is 100 or more Evaluation 2: Releasing Test at Cut End Each glass carrier-attached copper foil 10 was cut along the middles of the widths of the lines of the pattern of the rough region with a stainless steel cutter. An adhesive tape (a cellophane tape) was attached to the copper layer 18 adjoining the cut end of the glass carrier-attached copper foil 10 and then released. The separation of the copper layer 18 at the cut end accompanied by the release of the adhesive tape was observed and rated on the following criteria:
Rating A: no separation of the copper layer from the cut end was found
Rating B: partial separation of the copper layer from the cut end was found
Rating C: most separation of the copper layer from the cut end was found
Rating D: spontaneous separation of the copper layer was found before attachment of the adhesive tape Evaluation 3: Number of Chippings Produced by Cutting Rough Region Each glass carrier-attached copper foil 10 was cut along the middles of widths of the lines of the pattern of the rough region with a dicing device. The cut end of the glass carrier-attached copper foil 10 was observed with a microscope. The number of chippings was counted that had a size corresponding to a region of 1 mm or more at the edge of the glass carrier. The counted number was converted into the number of chippings per cut length of 1 cm. The converted number of chippings was rated on the following criteria:
Rating A: the number of chippings with a size of 1 mm or more per cut length of 1 cm is less than 10
Rating B: the number of chippings with a size of 1 mm or more per cut length of 1 cm is 10 or more and less than 30
Rating C: the number of chippings with a size of 1 mm or more per cut length of 1 cm is 30 or more Table 1 shows that Examples 1 to 7 and 9 to 11 each having a rough region with a maximum height Rz within a range of 1.0 to 30.0 μm on the glass carrier have satisfactory results on Evaluations 1 to 3. Thus, each of these glass carrier-attached copper foils can be cut along the pattern of the rough region to quite effectively prevent separation of, for examples, the copper layer from the cut end and production of granular fragments and chippings from the glass carrier while being downsized to dimensions enabling mount of circuits.

The invention claimed is:
1. A glass carrier-attached copper foil comprising:
a glass carrier;
a release layer provided on the glass carrier; and
a copper layer provided on the release layer and having a thickness of 0.1 to 3.0 μm,
wherein the glass carrier has, at least on its surface having the copper layer thereon, a plurality of flat regions each having a maximum height Rz of less than 1.0 μm as measured in accordance with JIS B 0601-2001; and a rough region having a maximum height Rz of 1.0 to 30.0 μm as measured in accordance with JIS B 0601-2001, the rough region having a pattern of lines that define the flat regions.
2. The glass carrier-attached copper foil according to claim 1, wherein an outer face of the copper layer has a flat profile corresponding to the surface profile of the flat regions of the glass carrier and a rough profile corresponding to the surface profile of the rough region of the glass carrier.
3. The glass carrier-attached copper foil according to claim 1, further comprising an intermediate layer between the glass carrier and the release layer, the intermediate layer comprising at least one metal selected from the group consisting of Cu, Ti, Al, Nb, Zr, Cr, W, Ta, Co, Ag, Ni, In, Sn, Zn, Ga, and Mo.
4. The glass carrier-attached copper foil according to claim 1, further comprising a functional layer between the release layer and the copper layer, the functional layer composed of at least one metal selected from the group consisting of Ti, Al, Nb, Zr, Cr, W, Ta, Co, Ag, Ni, and Mo.
5. The glass carrier-attached copper foil according to claim 1, wherein the glass carrier is made of glass comprising $SiO_2$.

TABLE 1

| | Rough region | | | | Evaluation | | |
| --- | --- | --- | --- | --- | --- | --- | --- |
| | Rz (μm) | Release strength (gf/cm) | Average line width of the pattern (mm) | Ratio of the area of the rough region R to the total area of the flat regions F and the rough region R R/(F + R) | Number of granular fragments produced by cutting the rough region | Releasing test at cut end | Number of chippings produced by cutting rough region |
| Ex. 1 | 1.0 | 30 | 2.5 | 0.01 | C | C | C |
| Ex. 2 | 1.5 | 79 | 2.5 | 0.05 | C | C | B |
| Ex. 3 | 2.0 | 252 | 2.5 | 0.10 | C | B | B |
| Ex. 4 | 2.6 | 403 | 2.5 | 0.25 | B | B | B |
| Ex. 5 | 2.9 | 486 | 2.5 | 0.30 | B | B | B |
| Ex. 6 | 2.6 | 403 | 50 | 0.50 | C | B | A |
| Ex. 7 | 2.9 | 486 | 0.5 | 0.15 | B | B | B |
| Ex. 8* | 0.8 | 15 | 2.5 | 0.10 | D | D | C |
| Ex. 9 | 8.0 | 1450 | 10 | 0.25 | A | A | B |
| Ex. 10 | 16.4 | 1870 | 10 | 0.25 | A | A | A |
| Ex. 11 | 19.5 | 1880 | 10 | 0.25 | A | A | A |

*indicates Comparative Example.

6. The glass carrier-attached copper foil according to claim 1, wherein the pattern of the rough region has a line width of 1 to 50 mm.

7. The glass carrier-attached copper foil according to claim 1, wherein the rough region has a lattice pattern, a fence pattern, or a cruciform pattern.

8. The glass carrier-attached copper foil according to claim 1, wherein a ratio of the area of the rough region of the glass carrier to the total area of the flat regions and the rough region of the glass carrier is 0.01 to 0.5.

9. The glass carrier-attached copper foil according to claim 1, wherein the glass carrier at the rough region has a release strength of 30 to 3000 gf/cm.

10. The glass carrier-attached copper foil according to claim 1, wherein the rough region is designed to be cut along the pattern such that the glass carrier-attached copper foil is divided into a plurality of pieces.

11. A method of producing the glass carrier-attached copper foil according to claim 1, comprising:
providing a glass carrier at least one surface of which is a flat face with a maximum height Rz of less than 1.0 μm as measured in accordance with JIS B 0601-2001;
roughening a predetermined region of the surface of the glass carrier to form a rough region having a pattern of lines that define a plurality of unprocessed regions, the rough region having a maximum height Rz of 1.0 to 30.0 μm as measured in accordance with JIS B 0601-2001;
forming a release layer on the glass carrier; and
forming a copper layer having a thickness of 0.1 to 3.0 μm on the release layer.

12. The method according to claim 11, wherein the roughening comprises abrasive blasting or etching.

13. The method according to claim 11, further comprising:
before the roughening, forming a masking layer in the unprocessed regions other than the predetermined region on the glass carrier, and
removing the masking layer after the roughening.

14. The method according to claim 12, wherein the roughening comprises abrasive blasting comprising projecting particulate media onto the glass carrier from a nozzle at a discharge pressure of 0.01 to 0.1 MPa, the particulate media having a diameter of 1.0 to 1000 μm, the nozzle having an aperture with a diameter of 0.5 to 10.0 mm.

15. The method according to claim 11, wherein the release layer is formed by physical vapor deposition (PVD).

16. The method according to claim 11, wherein the copper layer is formed by physical vapor deposition (PVD).

* * * * *